(12) United States Patent
Lee

(10) Patent No.: US 8,416,162 B2
(45) Date of Patent: Apr. 9, 2013

(54) DISPLAY APPARATUS

(75) Inventor: Seung-Jin Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 281 days.

(21) Appl. No.: 12/977,676

(22) Filed: Dec. 23, 2010

(65) Prior Publication Data

US 2011/0267573 A1 Nov. 3, 2011

(30) Foreign Application Priority Data

May 3, 2010 (KR) .................. 10-2010-0041435

(51) Int. Cl.
*G09G 3/32* (2006.01)

(52) U.S. Cl.
USPC .......................................... 345/82

(58) Field of Classification Search ........ 345/82
See application file for complete search history.

(56) References Cited

U.S. PATENT DOCUMENTS

| | | | |
|---|---|---|---|
| 4,862,153 A * | 8/1989 | Nakatani et al. ............. | 345/80 |
| 6,897,919 B2 | 5/2005 | Enomoto et al. | |
| 7,358,532 B2 | 4/2008 | Nakagawa | |
| 7,372,438 B2 | 5/2008 | Chung et al. | |
| 7,391,393 B2 * | 6/2008 | Yang et al. ................... | 345/76 |
| 7,948,743 B2 * | 5/2011 | Kim et al. ............... | 361/679.21 |
| 2004/0160183 A1 | 8/2004 | Kim | |
| 2008/0024714 A1 | 1/2008 | Park | |
| 2008/0042549 A1 | 2/2008 | Song et al. | |
| 2009/0167171 A1 * | 7/2009 | Jung et al. ................... | 313/504 |
| 2009/0237907 A1 | 9/2009 | Kunimoto et al. | |
| 2011/0267573 A1 * | 11/2011 | Lee ............................. | 349/150 |
| 2012/0099281 A1 * | 4/2012 | Kim et al. .................... | 361/720 |
| 2012/0274596 A1 * | 11/2012 | Ludwig ....................... | 345/173 |

FOREIGN PATENT DOCUMENTS

| | | |
|---|---|---|
| JP | 2002353274 A | 12/2002 |
| KR | 10-2008-0016271 A | 2/2008 |
| KR | 1020080034537 A | 4/2008 |
| KR | 1020090090547 A | 8/2009 |

OTHER PUBLICATIONS

Korean Office Action issued by the Korean Patent Office on Sep. 27, 2011 in the corresponding Korean Patent Application No. 2010-0041435.

* cited by examiner

*Primary Examiner* — Timothy L Rude
(74) *Attorney, Agent, or Firm* — Robert E. Bushnell, Esq.

(57) ABSTRACT

A display apparatus capable of preventing electromagnetic noise. The display apparatus includes a substrate, a sealing member facing the substrate, a display unit arranged between the substrate and the sealing member, a driving chip arranged on the substrate to transmit an electrical signal to the display unit, a conductive cover layer covering the driving chip and a flexible circuit substrate including a conductive cover layer and signal line, the signal line being electrically connected to the driving chip.

12 Claims, 2 Drawing Sheets

DISPLAY APPARATUS

CLAIM OF PRIORITY

This application claims the benefit of Korean Patent Application No. 10-2010-0041435, filed on May 3, 2010, in the Korean Intellectual Property Office, the disclosure of which is incorporated herein in its entirety by reference.

BACKGROUND OF THE INVENTION

1. Field of the Invention

The present invention relates to a display apparatus capable of easily protecting against electromagnetic interference (EMI) and electromagnetic waves.

2. Description of the Related Art

Recently, as attention and research have been focused on the display apparatus. In particular, among the display apparatuses, liquid crystal displays (LCDs) and organic light-emitting display apparatuses have attracted much attention because they can be applied to portable, thin, flat panel display apparatuses.

Such a display apparatus includes a display unit that emits visible rays and a driving chip that applies electrical signals to the display unit through a flexible circuit substrate. As display apparatuses have high resolution, an applied electrical signal becomes complicated, and accordingly a high-frequency signal is used. Thus, electromagnetic waves are generated by the driving chip. Also, heat is generated by the driving chip and members arranged around the driving chip are damaged due to these electromagnetic waves, thereby deteriorating a picture quality of the display apparatus.

SUMMARY OF THE INVENTION

The present invention provides a display apparatus capable of easily preventing electromagnetic interference (EMI) caused by electromagnetic waves produced by the driving chip.

According to an aspect of the present invention, there is provided a display apparatus including a substrate, a sealing member facing the substrate, a display unit arranged between the substrate and the sealing member, a driving chip arranged on the substrate to transmit an electrical signal to the display unit and a flexible circuit substrate including a conductive cover layer and a signal line, the signal line being electrically connected to the driving chip, the conductive cover layer covering the driving chip. The signal line and the conductive cover layer may be electrically insulated from each other by an insulating layer. The conductive cover layer may include a metal. The conductive cover layer may be spaced-apart from the driving chip. The substrate may include an extended portion that is absent of the sealing member, the driving chip may be arranged within the extended portion of the substrate. The display apparatus may also include a protection layer comprising an insulating material arranged on the conductive cover layer. The conductive cover layer may prevent electromagnetic waves produced in a vicinity of the driving chip from reaching the display unit. The display unit may include a plurality of pixels, each pixel may include a thin film transistor and an organic light-emitting device electrically connected to the thin film transistor, the organic light-emitting device may include an organic light-emitting layer.

According to another aspect of the present invention, there is provided a display apparatus that includes a substrate having a display portion and an extended portion external to the display portion, a sealing member arranged on the substrate in the display portion only, a display unit arranged between the substrate and the sealing member, a driving chip arranged on the extended portion of the substrate, a flexible circuit substrate including a signal line electrically connected to the driving chip and a conductive cover layer covering the driving chip, the driving chip may receive signals from an outside through the signal line of the flexible circuit substrate and transmit said signals to the display unit. The extended portion of the substrate may include a plurality of signal wires electrically connected to the driving chip and the display unit. The conductive cover layer may block electromagnetic waves generated in a vicinity of the driving chip and prevent said electromagnetic waves from reaching the display unit. The conductive cover layer may be an electromagnetic shield that prevents electromagnetic interference produced in a vicinity of the driving chip from reaching the display unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Now, an exemplary embodiment of the present invention will be described in detail with reference to the accompanying drawings.

Figure 1:
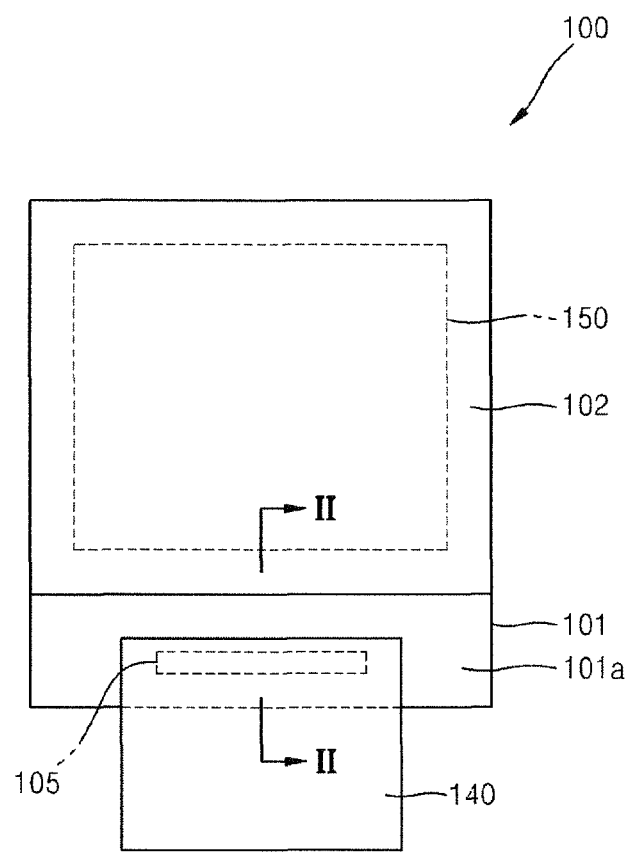
FIG. 1 is a schematic plane view illustrating a display apparatus according to an embodiment of the present invention.
Figure 2:
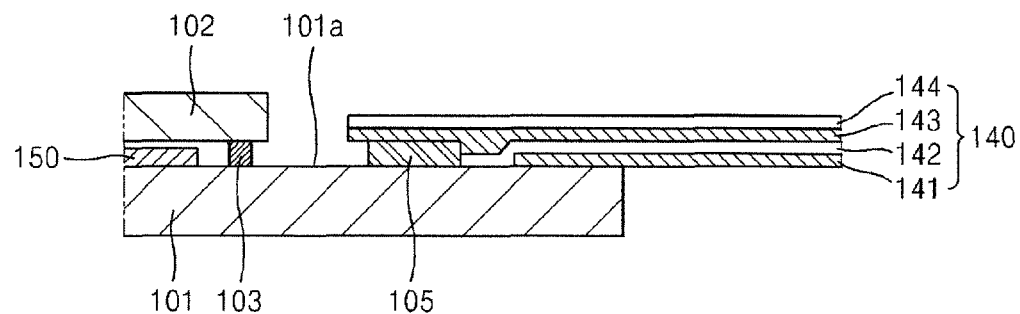
FIG. 2 is a cross-sectional view taken along a line II-II of FIG. 1.

Turning now to FIGS. 1 and 2, FIG. 1 is a schematic plan view illustrating a display apparatus 100 according to an embodiment of the present invention and FIG. 2 is a cross-sectional view taken along a line II-II of FIG. 1. Referring to FIGS. 1 and 2, the display apparatus 100 includes a substrate 101, a sealing member 102, a display unit 150, a driving chip 105, and a flexible circuit substrate 140.

The substrate 101 may be made out of a transparent glass material including $SiO_2$ as a main component, however the present invention is not limited thereto and thus the substrate 101 may instead be made out of a transparent plastic. The transparent plastic for forming of the substrate 101 may be any organic material selected from the group consisting of polyethersulphone (PES), polyacrylate (PAR), polyetherimide (PEI), polyethyelenen napthalate (PEN), polyethyelene-terepthalate (PET), polyphenylene sulfide (PPS), polyallylate, polyimide, polycarbonate (PC), cellulose triacetate (TAC), and cellulose acetate propionate (CAP), which are insulating materials.

The sealing member 102 is arranged on the substrate 101 so as to face the substrate 101. The sealing member 102 prevents water and oxygen from entering the display unit 150 arranged between the sealing member 102 and the substrate 101. The sealing member 102 may be made out of glass or plastic, or may be a stacked structure including organic thin films and inorganic thin films. The sealing member 102 may be made out of the same material as the substrate 101.

An extended portion 101a is formed at one side of the substrate 101. The sealing member 102 is not arranged on and thus does not overlap the extended portion 101a of substrate 101. The extended portion 101a may include signal wires (not shown) that are electrically connected to the display unit 150.

The display unit 150 is disposed between the substrate 101 and the sealing member 102. The substrate 101 and the sealing member 102 are bonded to each other through a sealant 103, however, the present invention is not limited thereto as a sealant may not be necessary when the sealing member 102 is a stack of thin films of organic and inorganic materials that directly contacts the substrate 101.

The driving chip 105 is arranged on the extended portion 101a of substrate 101. The driving chip 105 sends electrical signals to the display unit 150. For example, the driving chip 105 may be a driver IC. The driving chip 105 is electrically connected to signal wires of the extended portion 101a by including an output pin and an input pin, and is electrically connected to the display unit 150 through the signal wires. The driving chip 105 and the signal wires of the extended portion 101a may be connected to each other via an anisotropic conductive film (ACF).

The flexible circuit substrate 140 is disposed to be electrically connected to sides of the driving chip 105. The flexible circuit substrate 140 sends driving signals transmitted from the outside to the driving chip 105. The flexible circuit substrate 140 may be made out of a flexible material and may be bent toward a rear surface of the substrate 101.

Referring now to FIG. 2, the flexible circuit substrate 140 includes a signal line 142 and a conductive cover layer 144. The signal line 142 is connected to the driving chip 105 and sends a signal to the driving chip 105. Here, the signal line 142 may be formed on a base film 141. The base film 141 is made out of a material having insulating properties that is flexible and protects the signal line 142. The base film 141 improves an overall durability of the flexible circuit substrate 140. Although not shown in FIG. 2, a protection layer that includes an insulating material, may further be formed on the conductive cover layer 144.

An insulating layer 143 is formed on the signal line 142. The signal line 142 and the conductive cover layer 144 are insulated from each other by the insulating layer 143. The insulating layer 143 may be made out of various other insulating materials.

The conductive cover layer 144 is arranged on the signal line 142 and is designed to be longer than the signal line 142 so that the conductive cover layer 144 also covers the driving chip 105. The conductive cover layer 144 is spaced-apart from the driving chip 105 by insulating layer 143. The conductive cover layer 144 may be made out of various conductive materials, but may include a metal in view of conductivity, flexibility, and durability.

Electromagnetic waves such as electromagnetic noise are easily generated in the vicinity of the driving chip 105 due to the electrical signals. In particular, as the display apparatus 100 has a high resolution, the amount of data to be processed per unit time increases, and consequently the display apparatus 100 uses high-frequency electrical signals that can produce the electromagnetic waves around the driving chip 105.

However, in the current embodiment, the conductive cover layer 144 is arranged to cover the driving chip 105. The conductive cover layer 144 serves as an electromagnetic shield and blocks electromagnetic waves generated around the driving chip 105. That is, the conductive cover layer 144 functions as a ground, and thus reduces the propagation of electromagnetic waves produced in the vicinity of the driving chip 105.

As a result, the conductive cover layer 144 may prevent the picture quality of the display apparatus 100 from being degraded due to the electromagnetic waves produced in the vicinity of the driving chip 105. Also, the conductive cover layer 144 may prevent components of the display apparatus 100 from being damaged due to heat generated by the electromagnetic waves. Furthermore, the conductive cover layer 144 is formed to cover the driving chip 105, so that the driving chip 105 may be easily protected from being damaged by an external force.

Figure 3:
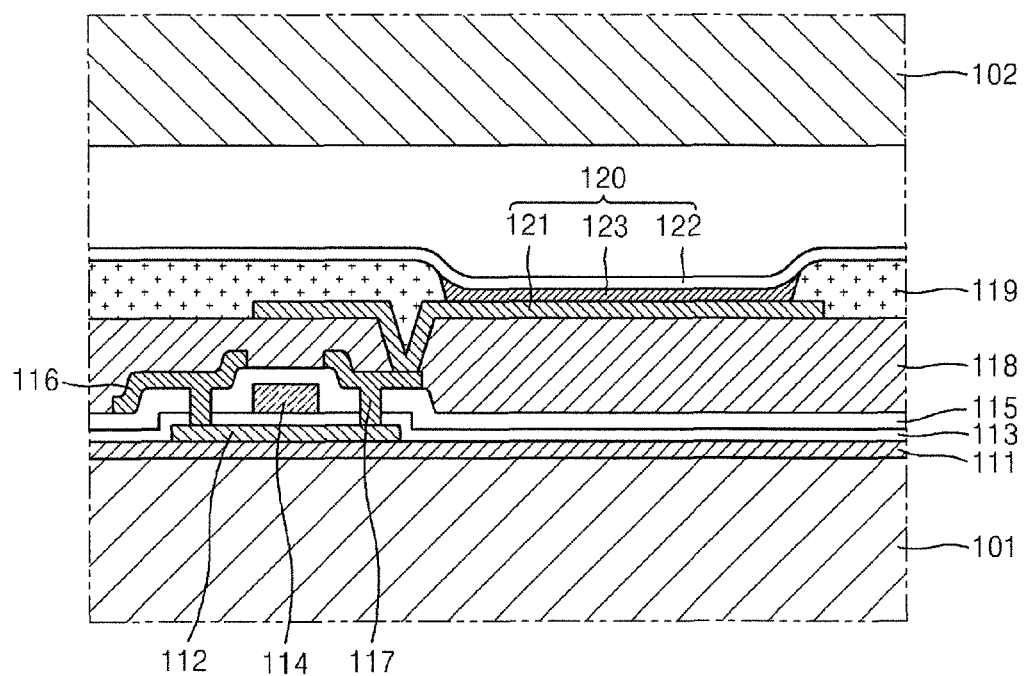
FIG. 3 is a schematic cross-sectional view of a pixel of the display unit of FIG. 1.

Turning now to FIG. 3, FIG. 3 is a schematic cross-sectional view of a pixel in the display unit 150 of FIG. 1. The display apparatus 100 according to the current embodiment includes the display unit 150 including a plurality of pixels, each pixel including an organic light-emitting device 120 and a thin film transistor, however the present invention is not limited thereto, and thus a liquid crystal display apparatus may be used instead of the organic light-emitting device.

The configuration of a pixel in the display unit 150 will now be described in detail with reference to FIG. 3. In FIG. 3, for convenience of description, only one pixel of an organic light-emitting device 120 is illustrated as being between the substrate 101 and the sealing member 102, but a plurality of pixels, each of which include an organic light-emitting device 120, may be disposed within the display unit 150.

A buffer layer 111 is formed on the substrate 101. The buffer layer 111 forms a flat surface on the substrate 101 and prevents external substances, such as water, from entering the substrate 101. An active layer 112 having a predetermined pattern is formed on the buffer layer 111. The active layer 112 may be made out of an inorganic semiconductor, such as silicon or polysilicon, or an organic semiconductor, and includes source, drain, and channel regions.

The source and drain regions may be formed by doping impurities into the active layer 112 made out of an amorphous silicon or polysilicon. If the active layer 112 is doped with boron (B), which is a group III element, a p-type semiconductor may be formed. On the other hand, if the active layer 112 is doped with nitrogen (N) which is a group V element, an n-type semiconductor may be formed.

A gate insulating film 113 is formed on the active layer 112, and a gate electrode 114 is formed on a portion of the gate insulating film 113 that corresponds to the channel region of the active layer 112. The gate insulating film 113 insulates the active layer 112 and the gate electrode 114 from each other, and may be made out of an inorganic material such as $SiN_x$ or $SiO_2$.

The gate electrode 114 may be made out of any one metal selected from the group consisting of gold (Au), silver (Ag), copper (Cu), nickel (Ni), platinum (Pt), palladium (Pd), aluminum (Al), molybdenum (Mo), and an alloy such as Al:Nd or Mo:W, or an alloy thereof, however the present invention is not limited thereto, and thus the gate electrode 114 may instead be made out of other various materials in consideration of adhesion, flatness, an electrical resistance and workability. The gate electrode 114 is connected to a gate line (not shown) via which an electrical signal is applied. With the formation of the gate electrode 114 over a channel region of an active layer 112, the thin film portion of the pixel of a display unit is completed.

An insulating interlayer 115 is then formed on the gate electrode 114. The insulating interlayer 115 and the gate insulating film 113 are formed in such a way as to expose the source and drain regions.

A source electrode 116 and a drain electrode 117 are formed to contact the exposed regions of the active layer 112. Materials for forming the source electrode 116 and the drain electrode 117 may be any one material selected from the group consisting of Au, Pd, Pt, Ni, rhodium (Rh), ruthenium (Ru), iridium (Ir), osmium (Os), Al, and Mo, or an alloy including at least two metals thereof, for example, an Al:Nd alloy or a MoW alloy, but the present invention is not limited thereto.

A passivation layer 118 is formed to cover the source electrode 116 and the drain electrode 117. The passivation layer 118 may be made out of an inorganic insulating layer and/or an organic insulating layer. The inorganic insulating layer may include any one material selected from the group consisting of $SiO_2$, $SiN_x$, SiON, $Al_2O_3$, $TiO_2$, $Ta_2O_5$, $HfO_2$, $ZrO_2$, $(Ba,Sr)TiO_3$ (BST), and lead zirconate titanate (PZT). The organic insulating layer may include any one polymer selected from the group consisting of a general-purpose polymer (poly(methyl methacrylate) (PMMA), polystyrene (PS)), a polymer derivative having a phenol group, an acryl-based polymer, an imide-based polymer, an aryl ether-based polymer, an amide-based polymer, a fluorine-based polymer, a p-xylene-based polymer, and a vinyl alcohol-based polymer, or a blend of the foregoing. The passivation layer 118 may be a stacked structure that includes inorganic insulating layers and/or organic insulating layers. The passivation layer 118 is formed in such a way as to expose the drain electrode 117 so that the organic light-emitting device 120 may be electrically connected to the drain electrode 117.

The organic light-emitting device 120 includes a first electrode 121, a second electrode 122, and an intermediate layer 123 between the first electrode 121 and the second electrode 122, the first electrode 121 being electrically connected to the drain electrode 117. The intermediate layer 123 includes an organic light-emitting layer that emits visible rays when a voltage difference is applied to the intermediate layer 123 through the first electrode 121 and the second electrode 122.

A pixel-defining layer 119 made out of an insulating material is formed on the first electrode 121. A predetermined opening is formed in the pixel-defining layer 119 to expose the first electrode 121. The intermediate layer 123 is formed on the exposed first electrode 121. The second electrode 122 is formed on the intermediate layer 123.

The first electrode 121 and the second electrode 122 may have polarities of an anode and a cathode, respectively, however the polarities of the first electrode 121 and the second electrode 122 may instead be reversed. The sealing member 102 is then disposed on the second electrode 122.

According to the present invention, the conductive cover layer 144 is formed to cover the driving chip 105, and thus the amount of electromagnetic waves generated in the vicinity of the driving chip 105 may be blocked, thereby improving a picture quality of the display apparatus 100 and preventing components of the display apparatus 100 from being damaged. In addition, the conductive cover layer 144 may prevent the driving chip 105 from being damaged due to external pressure and external substances.

According to the present invention, a display apparatus can easily prevent electromagnetic interference of the display apparatus from electromagnetic interference caused by electromagnetic waves generated in the vicinity of the driving chip 105.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display apparatus, comprising:
   a substrate;
   a sealing member facing the substrate;
   a display unit arranged between the substrate and the sealing member;
   a driving chip arranged on the substrate to transmit an electrical signal to the display unit; and
   a flexible circuit substrate including a conductive cover layer and a signal line, the signal line being electrically connected to the driving chip, the conductive cover layer covering the driving chip.

2. The display apparatus of claim 1, wherein the signal line and the conductive cover layer are electrically insulated from each other by an insulating layer.

3. The display apparatus of claim 1, wherein the conductive cover layer comprises a metal.

4. The display apparatus of claim 1, wherein the conductive cover layer is spaced-apart from the driving chip.

5. The display apparatus of claim 1, wherein the substrate comprises an extended portion that is absent of the sealing member, the driving chip being arranged within the extended portion of the substrate.

6. The display apparatus of claim 1, further comprising a protection layer comprising an insulating material arranged on the conductive cover layer.

7. The display apparatus of claim 1, the conductive cover layer to prevent electromagnetic waves produced in a vicinity of the driving chip from reaching the display unit.

8. The display apparatus of claim 1, the display unit comprising a plurality of pixels, each pixel comprising:
   a thin film transistor; and
   an organic light-emitting device electrically connected to the thin film transistor, the organic light-emitting device including an organic light-emitting layer.

9. A display apparatus, comprising:
   a substrate having a display portion and an extended portion external to the display portion;
   a sealing member arranged on the substrate in the display portion only;
   a display unit arranged between the substrate and the sealing member;
   a driving chip arranged on the extended portion of the substrate;
   a flexible circuit substrate including a signal line electrically connected to the driving chip and a conductive cover layer covering the driving chip, the driving chip receiving signals from an outside through the signal line of the flexible circuit substrate and transmitting said signals to the display unit.

10. The display apparatus of claim 9, the extended portion of the substrate comprising a plurality of signal wires electrically connected to the driving chip and the display unit.

11. The display apparatus of claim 9, the conductive cover layer to block electromagnetic waves generated in a vicinity of the driving chip and prevent said electromagnetic waves from reaching the display unit.

12. The display apparatus of claim 9, the conductive cover layer being an electromagnetic shield that prevents electromagnetic interference produced in a vicinity of the driving chip from reaching the display unit.

* * * * *